United States Patent
Crockett (10) Patent No.: US 8,548,009 B2
(45) Date of Patent: Oct. 1, 2013

(54) FREQUENCY COMBINER SYSTEM AND RELATED METHODS

(75) Inventor: John Scott Crockett, Maricopa, AZ (US)

(73) Assignee: Comtech EF Data Corp., Tempe, AZ (US)

( * ) Notice: Subject to any disclaimer, the term of this patent is extended or adjusted under 35 U.S.C. 154(b) by 715 days.

(21) Appl. No.: 12/552,576

(22) Filed: Sep. 2, 2009

(65) Prior Publication Data

US 2009/0323724 A1 Dec. 31, 2009

(51) Int. Cl.
*H04J 1/02* (2006.01)
*H04J 15/00* (2006.01)

(52) U.S. Cl.
USPC .......... 370/497; 370/480; 370/353; 370/464; 375/229; 375/260; 375/340

(58) Field of Classification Search
USPC ................. 370/497, 480, 535, 464; 375/229, 375/222, 260, 340; 359/128, 127
See application file for complete search history.

(56) References Cited

U.S. PATENT DOCUMENTS

| | | | | |
|---|---|---|---|---|
| 6,529,303 | B1* | 3/2003 | Rowan et al. | 398/82 |
| 6,816,555 | B2* | 11/2004 | Sakoda | 375/260 |
| 6,907,083 | B2 | 6/2005 | Lillington | |
| 2001/0022811 | A1* | 9/2001 | Lillington | 375/229 |
| 2004/0012387 | A1* | 1/2004 | Shattil | 324/225 |
| 2005/0225460 | A1* | 10/2005 | Jensen | 341/61 |

* cited by examiner

*Primary Examiner* — Andrew Chriss
*Assistant Examiner* — Jamal Javaid
(74) *Attorney, Agent, or Firm* — Booth Udall Fuller, PLC (57) ABSTRACT

A combiner system for frequency combining and related methods. Implementations may include a plurality of combiner stages each including a deinterleaver, at least one filter, a frequency downconverter, and a frequency upconverter all operatively coupled together. Each of the plurality of combiner stages may be adapted to receive a complex interleaved input signal including two or more input signals each including a bandwidth, to output a complex stage output signal including the two or more input signals, and to alternately place the bandwidth of each of the two or more input signals in an upper portion and in a lower portion of an output bandwidth of the complex stage output signal. The upper portion and lower portion of the output bandwidth may be contiguous within the output bandwidth and joined at a center of the output bandwidth.

22 Claims, 7 Drawing Sheets

FREQUENCY COMBINER SYSTEM AND RELATED METHODS

BACKGROUND

1. Technical Field

Aspects of this document relate generally to systems and methods used to transmit data across telecommunication channels.

2. Background Art

Telecommunication systems receive data, process it into a desired format, and then send the formatted data across a telecommunication channel. Examples of telecommunication channels include wired interfaces, such as Ethernet, serial, parallel, Universal Serial Bus (USB) as well as wireless interfaces, such as 802.11a, 802.11n, Worldwide Interoperability for Microwave Access (WIMAX) 802.16, satellite, and infrared channels. Depending upon the interface type used, various components and method implementations are utilized to process the data in such a way that it can be transmitted across the channel in a form that will be recoverable at the receiving end as well as one that is robust to errors that may be introduced into the data as it passes through the channel. The portion of the telecommunication system (often a modem) that conventionally prepares the data for transmission through the channel is called a modulator.

SUMMARY

Implementations of a combiner system for frequency combining may include one or more combiner stages. Each of the one or more combiner stages may include a deinterleaver adapted to receive an interleaved input signal and to output a first input signal and a second input signal. The first input signal may have a bandwidth that at least partially overlaps a bandwidth of the second input signal. The one or more combiner stages may also include a first filter coupled with a frequency downconverter and adapted to receive the first input signal where the first filter and frequency downconverter are adapted to filter the first input signal and downconvert the bandwidth of the first input signal to form a first output signal. The one or more combiner stages may include a second filter coupled with a frequency upconverter and adapted to receive the second input signal where the second filter and frequency upconverter are adapted to filter the second input signal and upconvert the bandwidth of the second input signal to form a second output signal. The one or more combiner stages may also include a signal adder adapted to add the first output signal and the second output signal together to form a stage output signal such that a first output signal bandwidth is located in a lower portion of a stage output signal bandwidth and a second output signal bandwidth is located in an upper portion of the stage output signal bandwidth.

Implementations of a combiner system may include one, all, or any of the following:

The stage output signal may be interleaved.

The one or more combiner stages may each further include a selector multiplexer adapted to receive the stage output signal and the interleaved input signal. The selector multiplexer may be adapted to receive the stage output signal and the interleaved input signal. The selector multiplexer may be adapted to use control data included in the interleaved input signal to select when data from the interleaved input signal corresponding to a third input signal is included in a multiplexer output signal coupled to the selector multiplexer and when data from the stage output signal is included in the multiplexer output signal.

The interleaved input signal may include three or more input signals.

The one or more combiner stages may each include a first upsampler coupled between the deinterleaver and the first filter. The first upsampler may be adapted to upsample the first input signal prior to the first filter by a predetermined factor.

The one or more combiner stages may each include a second upsampler coupled between the deinterleaver and the second filter. The second upsampler may be adapted to upsample the second input signal prior to the second filter by the predetermined factor.

The stage output signal may have a sample rate that may be the same as a sample rate of the interleaved input signal.

The predetermined factor may be two.

The first filter and the second filter may be half-band linear-phase finite impulse response (FIR) filters.

Implementations of a second combiner system for frequency combining may include a plurality of combiner stages. Each of the plurality of combiner stages may include a deinterleaver, at least one filter, a frequency downconverter, and a frequency upconverter all operatively coupled together. Each of the plurality of combiner stages may be adapted to receive a complex interleaved input signal including two or more input signals each including a bandwidth and to output a complex stage output signal including the two or more input signals. Each of the plurality of combiner stages may be adapted to alternately place the bandwidth of each of the two or more input signals in an upper portion and in a lower portion of an output bandwidth of the complex stage output signal. The upper portion and lower portion of the output bandwidth may be contiguous within the output bandwidth and joined at a center of the output bandwidth. The width of the output bandwidth may be the sum of the width of each of the bandwidths of each of the two or more input signals.

Implementations of a second combiner system may include one, all, or any of the following:

The complex stage output signal may be interleaved.

The plurality of combiner stages may each further include a selector multiplexer and the selector multiplexer may be adapted to use control data in the complex interleaved input signal to determine when data corresponding to a third input signal in the interleaved input signal is included in a multiplexer output signal and when data from the complex stage output signal is included in the multiplexer output signal coupled to the selector multiplexer.

The plurality of combiner stages may each further include a first upsampler coupled between the deinterleaver and the at least one filter. The first upsampler may be adapted to upsample a first one of the two or more input signals prior to the at least one filter by a predetermined factor.

The plurality of combiner stages may each further include a second upsampler coupled between the deinterleaver and the at least one filter where the second upsampler is adapted to upsample a second one of the two or more input signals prior to the at least one filter by the predetermined factor.

The complex stage output signal may have a sample rate that is the same as a sample rate of the complex interleaved input signal.

The predetermined factor may be two.

The at least one filter may be a half-band linear-phase finite impulse response (FIR) filter.

Implementations of combiner systems may utilize implementations of a first method of frequency combining two or more input signals. Implementations of the first method may include deinterleaving an interleaved input signal to produce two or more input signals and filter a first input signal of the two or more input signals with at least one filter. The first input signal may have a bandwidth that at least partially overlaps a bandwidth of a second input signal of the two or more input signals. The method may also include frequency downconverting the first input signal to place the bandwidth of the first input signal in a lower portion of an output bandwidth of a stage output signal and filtering the second input signal with the at least one filter. The method may include frequency upconverting the second input signal to place the bandwidth of the second input signal in an upper portion of the output bandwidth of the stage output signal. The upper portion and the lower portion of the output bandwidth may be contiguous. The method may also include forming the stage output signal by adding the first input signal to the second input signal using a signal adder after filtering the first input signal and filtering the second input signal and sending the stage output signal for subsequent processing.

Implementations of the first method of frequency combining two or more input signals may include one, all, or any of the following:

The method may further include determining, using control data in the interleaved input signal and a selected multiplexer coupled with the interleaved input signals and the stage output signal, when data corresponding to a third input signal of the two or more input signals in the interleaved input signal is included in a multiplexer output signal and when data from the stage output signal is included in the multiplexer output signal.

The method may further include upsampling the first input signal and the second input signal by a predetermined factor prior to filtering the first input signal and filtering the second input signal.

Implementations of combiner systems may utilize implementations of a second method of frequency combining two or more input signals. Implementations of the second method may include frequency combining two or more input signals using one or more frequency combining stages to produce a stage output signal. Each of the one or more frequency combining stages may include at least one filter, a frequency upconverter, and frequency downconverter. Each of the one or more frequency combining stages may be adapted to deinterleave an interleaved input signal comprising the two or more input signals to produce at least a first input signal and second input signal. The first input signal may have a bandwidth that at least partially overlaps a bandwidth of the second input signal. Each of the one or more frequency combining stages may also be adapted to filter the first input signal with the at least one filter and frequency downconvert the first input signal to place the bandwidth of the first input signal in a lower portion of an output bandwidth of a stage output signal. Each of the one or more frequency combining stages may also be adapted to filter the second input signal with the at least one filter and frequency upconvert the second input signal to place the bandwidth of the second input signal in an upper portion of the output bandwidth of the stage output signal. Each of the one or more frequency combining stages may be adapted to form the stage output signal by adding the first input signal and the second input signal with a signal adder after filtering the first input signal and filtering the second input signal.

Implementations of a second method of frequency combining two or more input signals may include one, all, or any of the following:

The method may include bypassing one of the one or more frequency combining stages with a third input signal of the two or more input signals in the interleaved input signal by determining when data corresponding to the third input signal is included in a multiplexer output signal and when data from the stage output signal is included in the multiplexer output signal using control data in the interleaved input signal and a selector multiplexer coupled with the interleaved input signal and the stage output signal.

The method may further include upsampling the first input signal and the second input signal by a predetermined factor prior to filtering the first input signal and filtering the second input signal.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components or assembly procedures disclosed herein. Many additional components and assembly procedures known in the art consistent with the intended frequency combining system and/or assembly procedures for a frequency combining system will become apparent for use with particular implementations from this disclosure. Accordingly, for example, although particular implementations are disclosed, such implementations and implementing components may comprise any shape, size, style, type, model, version, measurement, concentration, material, quantity, and/or the like as is known in the art for such frequency combining systems and implementing components, consistent with the intended operation.

Figure 1A:
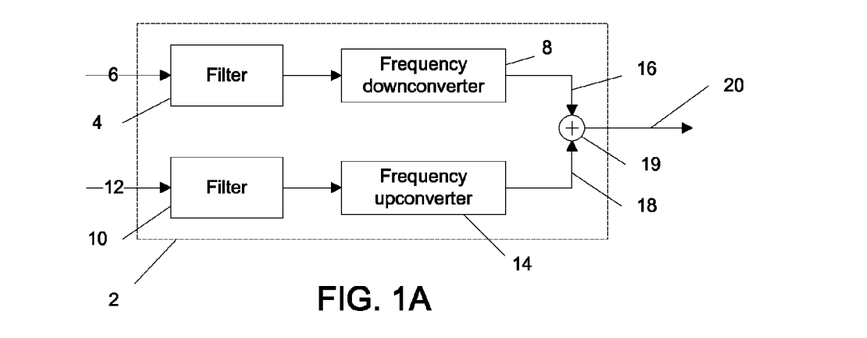
FIG. 1A is a block diagram of a first implementation of a frequency combining stage.

Referring to FIG. 1A, a first implementation of a frequency combining stage 2 is illustrated. The frequency combining stage 2 includes a first filter 4 adapted to receive a first input signal 6 which is coupled to a frequency downconverter 8 and a second filter 10 adapted to receive a second input signal 12 which is coupled to a frequency upconverter 14. The first filter 4 and frequency downconverter 8 are adapted to filter the first input signal 6 and downconvert the bandwidth of the first input signal 6 to form first output signal 16. Likewise, the second filter 10 and the frequency upconverter 14 are adapted to filter the second input signal 12 and upconvert the bandwidth of the second input signal 12 to form second output signal 18. Signal adder 19 is used to add the first output signal 16 to the second output signal 18 to produce stage output signal 20. Stage output signal 20 has a stage output signal bandwidth and, after the first output signal 16 and the second output signal 18 have been added, the bandwidth of the first output signal 16 is located in the lower portion of the stage output signal bandwidth and the bandwidth of the second output signal 18 is located in the upper portion.

The frequency upconverter 14 and frequency downconverter 16 can be configured to ensure that the bandwidth of the first output signal 16 and the bandwidth of the second output signal 18 are contiguous within the stage output signal bandwidth. Because the two bandwidths are located in the upper and lower portions of the stage output signal bandwidth, in particular implementations there may be substantially no guard band between the two bandwidths, allowing the stage output signal bandwidth to be the sum of the bandwidths of the first input signal 6 and the second input signal 12. The foregoing assumes that at least a portion of the bandwidth of the first input signal 6 overlaps at least a portion of the bandwidth of the second input signal 12. The first filter 4 and second filter 10 may be low pass filters in particular implementations and may be half-band linear-phase finite impulse response (FIR) filters with symmetric coefficients (add symmetric data before multiplication) and/or alternating zero coefficients (no multiplication required) in various implementations. In addition, the frequency upconversions and downconversions may be made using a frequency equal to the sampling frequency at the input to the frequency combining stage divided by 8.

Figure 1B:
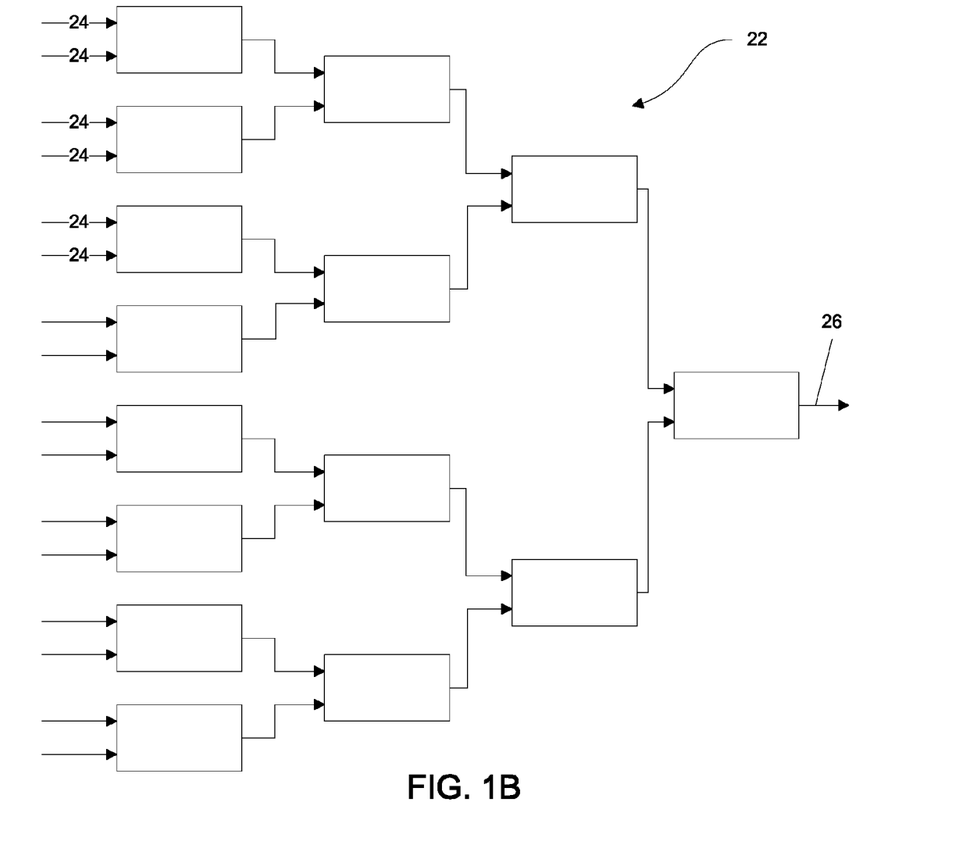
FIG. 1B is a block diagram of a plurality of frequency combining stage implementations like those illustrated in FIG. 1A being used to combine 16 signals.

Referring to FIG. 1B, a plurality of frequency combining stages 22 like the implementation illustrated in FIG. 1A is illustrated, showing how, when a first implementation of a frequency combining stage is utilized, 16 input signals 24 can be combined to form a single output signal 26 having a bandwidth that is the sum of each of the bandwidths of the input signals 24. Because of the arrangement of the plurality of frequency combining stages 22, the operation of the stages 22 can be described as alternately placing the bandwidth of each of the input signals 24 into the upper portion and lower portion of the output signal of each if the plurality of stages 22. Because each of the plurality of frequency combining stages 22 can process only two input signals, 15 stages are required to combine the 16 signals, which requires a fair amount of circuit complexity and the use of a number of components that each have a cost. Because of the process of successive combining, the total number of signals that can be combined is limited to those situations where the total number can always be successively divided by two. In various implementations of frequency combining stages disclosed in this document, the final output sample rate may be an exact power of 2 multiple of the smallest channel pitch (or bandwidth width) desired. The input sample rate for each channel or input signal into each stage may be exactly twice the channel pitch. Because of this, some implementations of frequency combining stages like those disclosed in this document may be able to position signals in the center 50% of the bandwidth of the stage output signals.

Figure 2A:
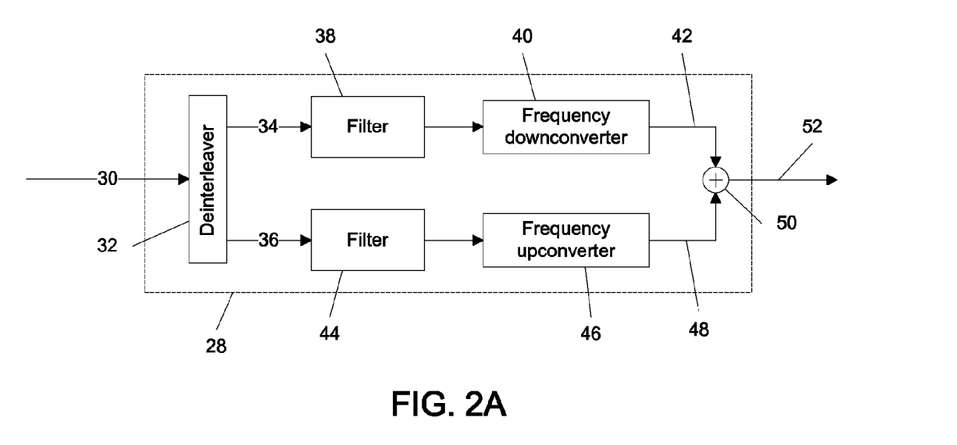
FIG. 2A is a block diagram of a second implementation of a frequency combining stage.

Referring to FIG. 2A, a second implementation of a frequency combining stage 28 is illustrated. The stage 28 includes an interleaved input signal 30 and a deinterleaver 32 adapted to receive it which outputs first input signal 34 and second input signal 36 which were included in the interleaved input signal 30. Because an interleaved input signal is received by second implementations of frequency combining stages, at some point upstream of each frequency combining stage an interleaver will be located as a separate component or interleaving may be a characteristic of the output of any other component (including another frequency combining stage) of the modulator within which the frequency combining stage is included. As illustrated, the first input signal 34 is received by a first filter 38 coupled to a frequency downconverter 40, both of which are adapted to filter the first input signal 34 and downconvert the bandwidth of the first input signal 34 to produce a first output signal 42. Likewise, the second input signal 36 is received by a second filter 44 coupled to a frequency upconverter 46 that are collectively adapted to filter the second input signal 36 and upconvert the bandwidth of the second input signal 36 to produce a second output signal 48. The first output signal 42 and second output signal 48 are then added together by a signal adder 50 to produce stage output signal 52. As in the first implementations of frequency combining stages previously described, the stage output signal 52 has a stage output signal bandwidth with an upper portion and a lower portion into which the bandwidths of the second input signal 36 and the first input signal 34, respectively, have been placed. In particular implementations, the upper portion and lower portion of the stage output signal bandwidth are contiguous.

Figure 2B:
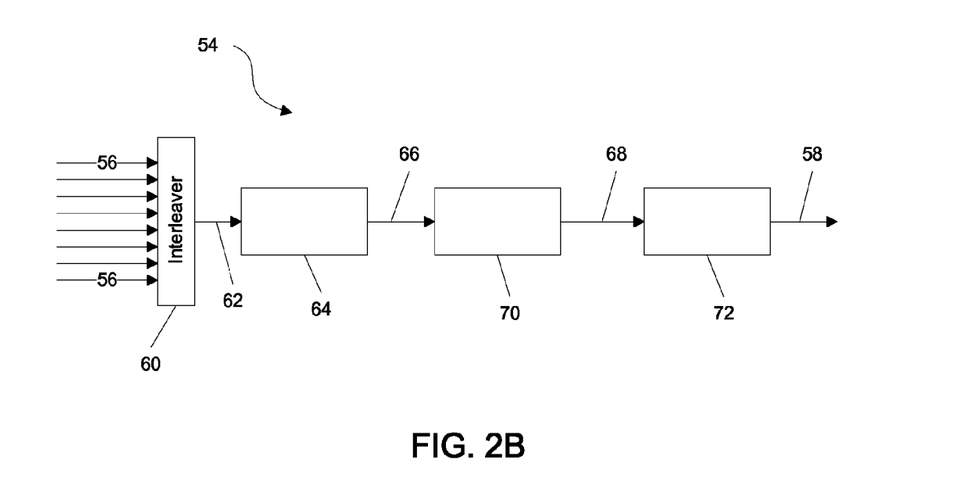
FIG. 2B is a block diagram of a plurality of frequency combining stage implementations like those illustrated in FIG. 2A being used to combine 8 signals.

Referring to FIG. 2B, a plurality of second implementations of frequency combining stages 54 are illustrated that combine 8 input signals 56 to form a single output signal 58. The use of interleaver 60 to interleave the 8 input signals 56 to produce interleaved input signal 62 is illustrated, though in various implementations, the function of interleaver 60 may be performed in any other upstream electronic component of a demodulator which incorporates the plurality of frequency combining stages 54. After leaving the first frequency combining stage 64 of the plurality of frequency combining stages 54, the resulting stage output signal 66 is an interleaved combination of four combined signals, each of which includes two of the 8 input signals. The stage output signal 68 of the second stage 70 is an interleaved combination of two combined signals, each of which includes four of the 8 input signals. The output signal 58 of the third stage 72 is a non-interleaved signal that contains all 8 of the input signals, the bandwidth of each located at a different point within the bandwidth of the output signal 58. FIG. 2B illustrates how the stage output signal from a particular stage within a plurality of frequency combining stages 54 may or may not be interleaved. Because of the use of interleaving, only three frequency combining stages are needed to combine the 8 signals; to combine 16 signals, only one additional stage would be needed, a significant reduction in complexity and component cost over the plurality of frequency combining stages 22 illustrated in FIG. 1B. An effect of utilizing interleaving in the combining process is that the sum of the sample rates of the input signals to each stage is twice the sample rate of the output signal of that stage. Accordingly, the output signal 58 has $1/8^{th}$ the sample rate of the sum of the sample rates of the input signals 56.

Figure 3A:
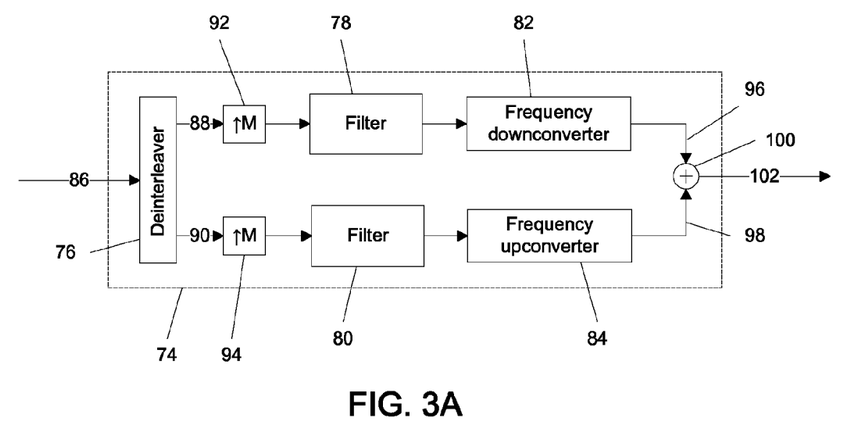
FIG. 3A is a block diagram of a third implementation of a frequency combining stage.

Referring to FIG. 3A, a third implementation of a frequency combining stage 74 is illustrated. Like the second implementation illustrated in FIG. 2A, the frequency combining stage 74 includes a deinterleaver 76, a first filter 78, a second filter 80, a frequency downconverter 82, and a frequency upconverter 84 all operatively coupled together and adapted to receive an interleaved input signal 86. Because the interleaved input signal 86 contains two interleaved signals, the first input signal 88 and second input signal 90 after the interleaver each have half of the sample rate of the interleaved input signal 86. To increase the sample rate of the first input signal 88 and the second input signal 90, first upsampler 92 and second upsampler 94, respectively, are used. First upsampler 92 and second upsampler 94 may utilize any of a wide variety of upsampling techniques and/or algorithms that allow the increasing of the sample rate of the signals without obscuring any of the useful information. After the first input signal 88 and second input signal 90 have been processed by the first upsampler 92 and second upsample 94, respectively, the sample rate of each of the two signals is increased. In particular implementations, the first upsampler 92 and second upsampler 94 are adapted to increase the sample rates by a factor of two, producing signals with the same sample rate as the interleaved input signal 86.

Like the second implementation illustrated in FIG. 2A, the first filter 78/frequency downconverter 82 combination is adapted to receive the first input signal 88 after it has been processed by the first upsampler 92 and downconvert a bandwidth of the first input signal 88 to produce a first output signal 96. Equivalently, the second filter 80/frequency upconverter 84 combination is adapted to receive the second input signal 90 after processing by the second upsampler 94 and upconvert a bandwidth of the second input signal 90 to produce second output signal 98. Signal adder 100 is then used to add the first output signal 96 to the second output signal 98 to produce stage output signal 102 that has a bandwidth with an upper portion containing the bandwidth of the second input signal 90 and a lower portion containing the bandwidth of the first input signal 88. The first and second portions may be contiguous as in various implementations previously discussed in this document. The stage output signal 102 has the same sample rate as the interleaved input signal 86, but twice the sample rate as the first or second input signals 88, 90.

Figure 3B:
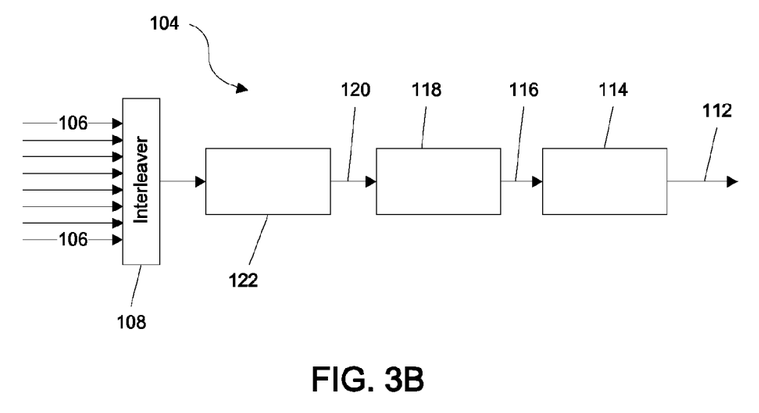
FIG. 3B is a block diagram of a plurality of frequency combining stage implementations like those illustrated in FIG. 3A being used to combine 8 signals.

Referring to FIG. 3B, an implementation of a plurality of frequency combining stages 104 is illustrated. Like the implementation illustrated in FIG. 2B, 8 input signals 106 are received by interleaver 108 to form a interleaved input to the first frequency combining stage 122, which is an implementation of a frequency combining stage like the one illustrated in FIG. 3A. The sample rate of each of the 8 input signals is $1/8^{th}$ of the sample rate of the stage output signal 112 leaving the third frequency combining stage 114, $1/4$ of the sample rate of the stage output signal 116 leaving the second frequency combining stage 118, and $1/2$ of the sample rate of the stage output signal 120 leaving the first frequency combining stage 122. As has been previously discussed, the bandwidth of the stage output signal 112 leaving the third frequency combining stage 114 is the sum of the bandwidths of the 8 input signals 106 and the stage output signal 112 is not interleaved.

Figure 4:
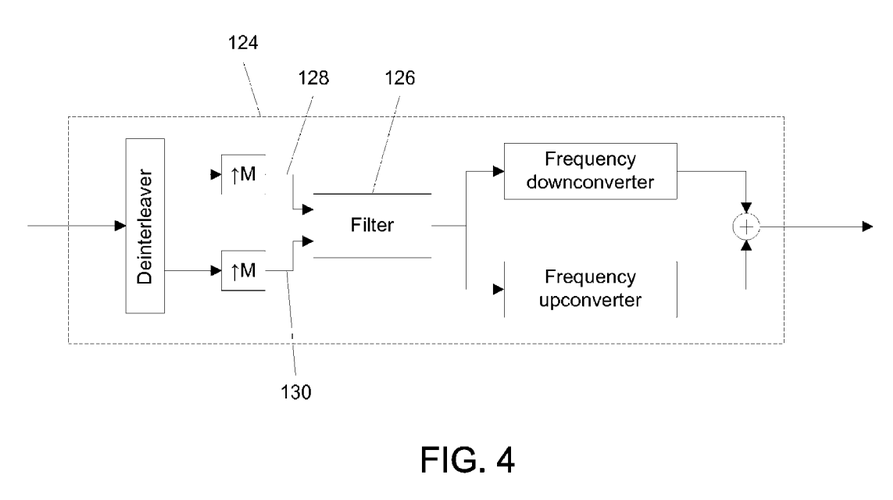
FIG. 4 is a block diagram of a fourth implementation of a frequency combining stage.

Referring to FIG. 4, a fourth implementation of a frequency combining stage 124 is illustrated. In the implementation illustrated, a single filter 126 may be used to filter both the upsampled first input signal 128 and the second input signal 130. In implementations where the single filter 126 is a finite impulse response (FIR) filter, the upsampling can be implicitly performed by the filter by assuming every second input is zero (which requires no addition or multiplication). Because in various implementations of FIR filters that may be utilized every second FIR coefficient (except the center tap) may be zero, every second FIR output becomes a scalar multiplication. The single filter 126 may be able to process both the upsampled first input signal 128 and the second input signal 130 by alternating between processing data from the first input signal 128 and the second input signal 130 and using a single multiplier to perform the scalar multiplication at each FIR output. Accordingly, only one filter may be used to filter both signals prior to frequency upconversion and downconversion.

Figure 5:
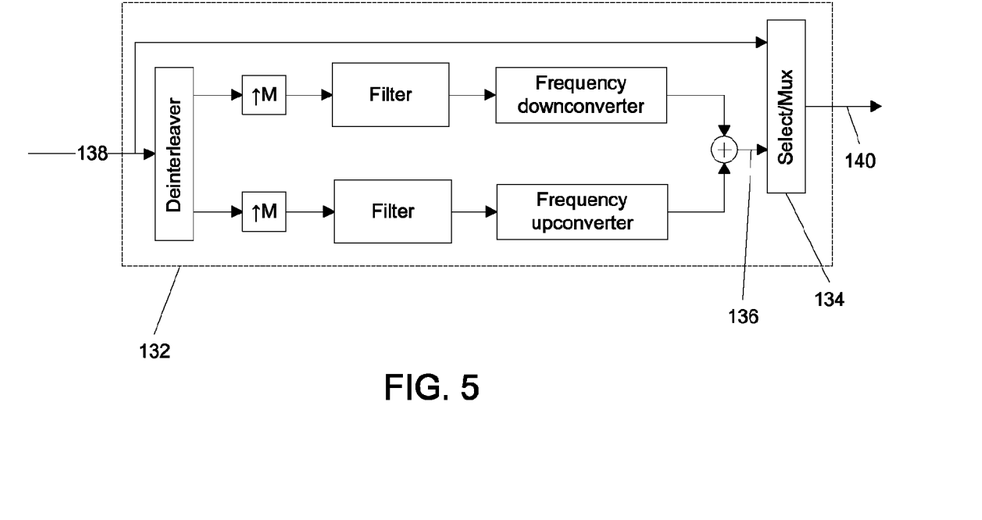
FIG. 5 is a block diagram of a fifth implementation of a frequency combining stage.

Referring to FIG. 5, a fifth implementation of a frequency combining stage 132 is illustrated. A selector multiplexer 134 is coupled to the stage output signal 136 and to the interleaved input signal 138. The selector multiplexer 134 utilizes control data included in, associated with, or related to the interleaved input signal 138 to determine when data from the interleaved input signal 138 should be included in the multiplexer output signal 140 (which passes to the next stage or for subsequent processing) and when data from the stage output signal 136 should be included in the multiplexer output signal 140. The control data may be received by the selector multiplexer 134 from one or more separate control inputs rather than directly from the interleaved input signal 138 in various implementations. In implementations of frequency combining stages 132 like those illustrated, the selector multiplexer 134 may allow a portion of the interleaved input signal 138 to skip or bypass the processing portions of the frequency combining stage 132. While the portion of the interleaved input signal is said to "skip" or "bypass" the frequency combining stage 132, since what passes to the selector multiplexer 134 from the interleaved input signal 138 is simultaneously processed by the frequency combining stage 132 components, the selector multiplexer 134 is actually choosing whether to include the specified processed or unprocessed portions of the stage input signal 138 in the multiplexer output signal 140 using the control data.

Figure 6:
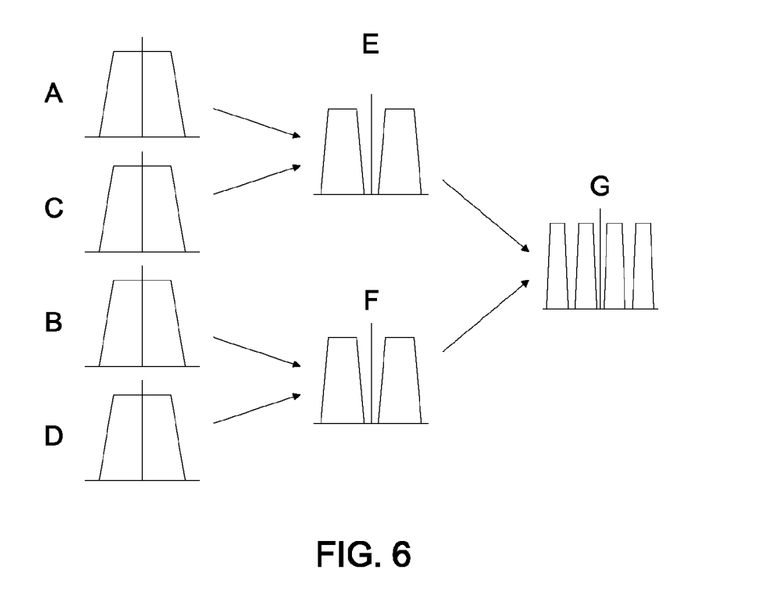
FIG. 6 is a diagram illustrating the combining of four signals A, B, C, and D that have equal bandwidth to form signal G.
Figure 7:
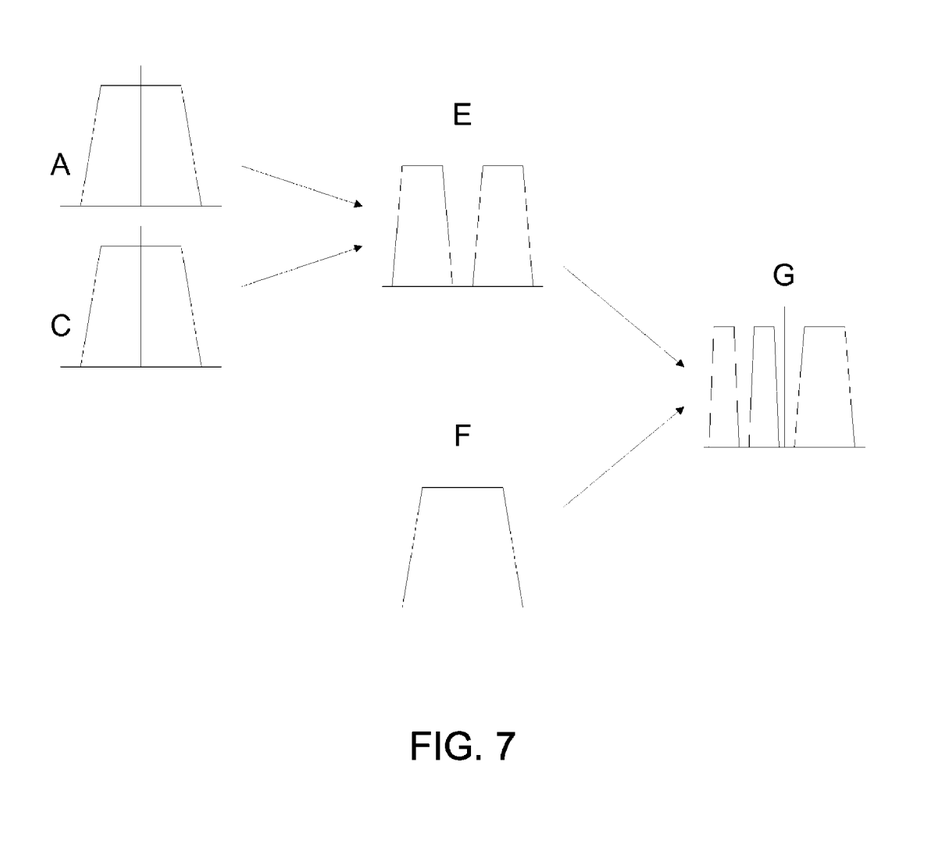
FIG. 7 is a diagram illustrating the combining of three signals A, C, and F with unequal bandwidth to form signal G showing the bypassing of signal F from the combining process used with signals A and C.

The process of bypassing one or more frequency combining stages can be illustrated by referring to FIGS. 6 and 7. As represented by FIG. 6, no bypassing takes place, as signals A, B, C, and D, each with equally spaced bandwidths and a sample rate R, are combined using one (or potentially more) frequency combining stages to form signals E and F, each with a sample rate 2R. Because signal E is made up of signals A and C, it occupies the time slots in the signal that originally were assigned to A and C. Signals E and F are subsequently combined using one frequency combining stage to form signal G, which has a sample rate 4R. Table 1 illustrates the time sequence of an interleaved input signal and two interleaved output signals passed from a first frequency combining stage and a second frequency combining stage:

TABLE 1

| | Time Slot | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | ... |
| Original Signals | A1 | B1 | C1 | D1 | A2 | B2 | C2 | D2 | A3 | B3 | C3 | D3 | ... |
| One Stage | E1 | F1 | E2 | F2 | E3 | F3 | E4 | F4 | E5 | F5 | E6 | F6 | ... |
| Two Stages | G1 | G2 | G3 | G4 | G5 | G6 | G7 | G8 | G9 | G10 | G11 | G12 | ... |

Referring to FIG. 7, a situation is represented where two R rate signals A and C are being combined with one 2R signal F. To enable the combination, signal F needs to occupy the positions in the time sequence that were occupied by E and F in the example represented in FIG. 6, except that signal F needs to be placed into that position originally, without being combined with either signal A or C in the first frequency combining stage. Accordingly, signal F is passed to the second frequency combining stage by bypassing the first frequency combining stage (which combines signals A and C to form signal E) using a selector multiplexer arrangement like that illustrated in FIG. 5. In this way, signal F receives a double share of the time slots in the original signal, and is not processed using a frequency combining stage until the second frequency combining stage of the plurality of frequency combining stages. Table 2 illustrates the resulting time sequence of an interleaved input signal and two interleaved output signals passed from a first frequency combining stage and a second frequency combining stage:

TABLE 2

| | Time Slot | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | ... |
| Original Signals | A1 | F1 | C1 | F2 | A2 | F3 | C2 | F4 | A3 | F5 | C3 | F6 | ... |
| One Stage | E1 | F1 | E2 | F2 | E3 | F3 | E4 | F4 | E5 | F5 | E6 | F6 | ... |
| Two Stages | G1 | G2 | G3 | G4 | G5 | G6 | G7 | G8 | G9 | G10 | G11 | G12 | ... |

Accordingly, in particular implementations of frequency combining stages, such as 2N-interleaved to N-interleaved frequency combining stages, N bits of control data can be written into or associated with the interleaved input stream to enable the selector multiplexer to determine which signals are to be combined (such as a first input signal and a second input signal) and which are not to be combined at that stage (such as a third input signal, which may be either the unprocessed first input signal, the unprocessed second input signal, or one or more other input signals, like a double or quadruple rate signal, included in the interleaved input signal in particular implementations). While the foregoing discussion focused on implementations where the output of the frequency combining stage was interleaved, the same principles could be used with frequency combining stages that do not produce an interleaved stage output signal. Also, while the example in FIG. 7 involves a double wide signal, signals that are four or more single signals wide could be combined using the principles disclosed in this document. In various implementations, whether a double wide or quad wide signal is to bypass a particular stage as a double or quad wide signal may be changed in real time and the bypassing altered, though some residual effects from the alteration may be observable for at least one filter length of samples after the change.

Figure 8:
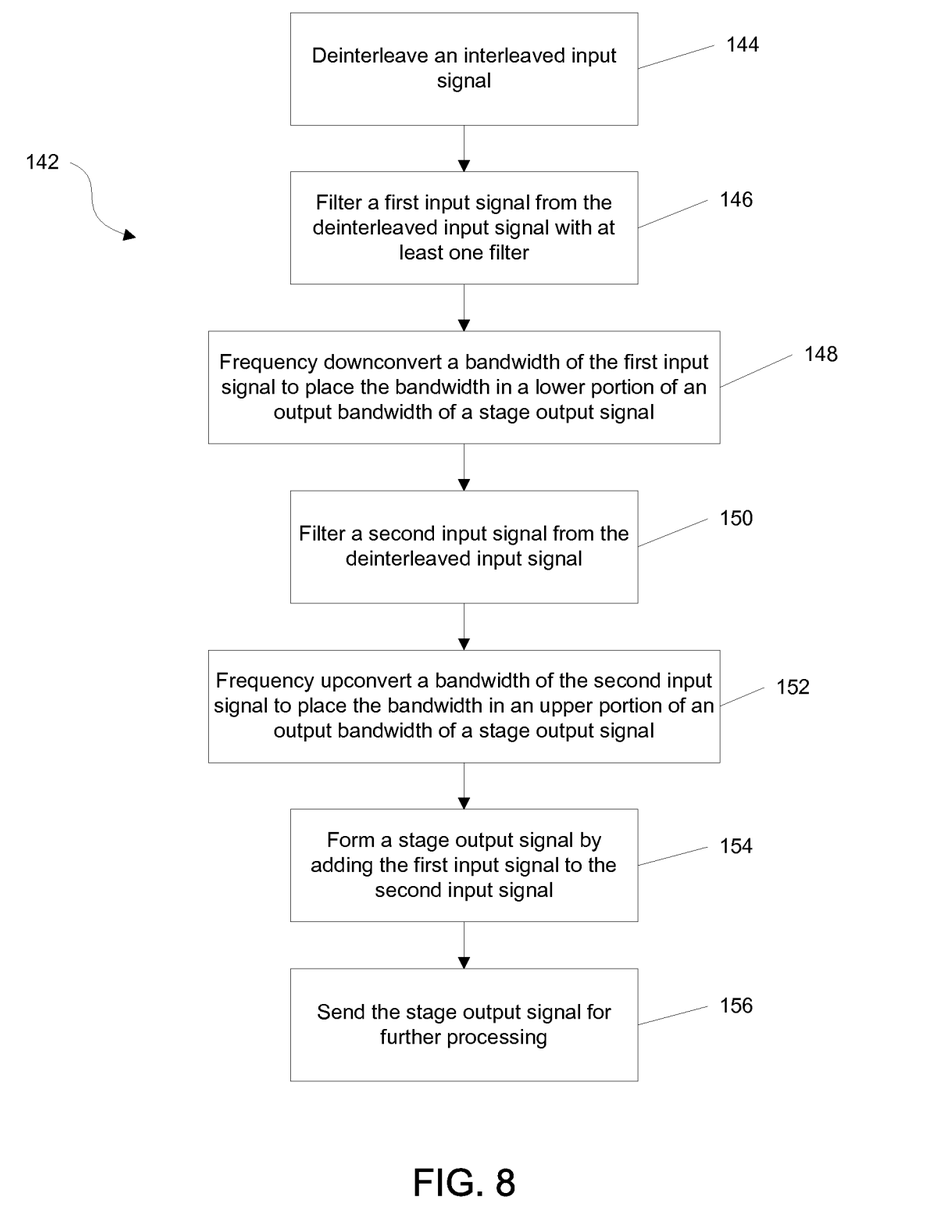
FIG. 8 is a flowchart of an implementation of a first method of frequency combining two or more input signals.

Implementations of frequency combining systems like those disclosed in this document may utilize various implementations of a method of frequency combining two or more input signals 142, an implementation of which is illustrated in FIG. 8. Implementations of the method 142 may include deinterleaving an interleaved input signal (step 144), filtering a first input signal from the deinterleaved input signal with at least one filter (step 146), and frequency downconverting a bandwidth of the first input signal to place the bandwidth in a lower portion of an output bandwidth of a stage output signal (step 148). The method 142 may further include filtering a second input signal from the deinterleaved input signal (step 150), frequency upconverting a bandwidth of the second input signal to place the bandwidth in an upper portion of an output bandwidth of a stage output signal (step 152), and forming a stage output signal by adding the first input signal to the second input signal (step 154). The method may also include sending the stage output signal for further processing (step 156).

Various implementations of methods of frequency combining two or more input signals may also include determining with control data included in the interleaved input signal and with a selector multiplexer coupled with the interleaved input signal and the stage output signal when data corresponding to a third input signal of the two or more input signals in the interleaved input signal is included in a multiplexer output signal and when data from the stage output signal is included in the multiplexer output signal. The third input signal may be a different input signal from the first input signal and the second input signal (such as a double or quad wide signal) or may be either the first input signal and the second input signal themselves prior to processing within the frequency combining stage. Also, the method may include upsampling the first input signal and the second input signal by a predetermined factor prior to filtering the first input signal and filtering the second input signal. In various implementations, the predetermined factor may be two.

In places where the description above refers to particular implementations of combiner systems and frequency combining stages and related method implementations it should be readily apparent that a number of modifications may be made without departing from the spirit thereof and that these implementations may be applied to other combiner systems and frequency combining stages and related method implementations.

The invention claimed is:

1. A combiner system for frequency combining comprising:
   one or more combiner stages each comprising:
      a deinterleaver adapted to receive an interleaved input signal comprised of a plurality of input signals that are time interleaved to share a single data pathway_and to output a first input signal and a second input signal, the first input signal having a bandwidth that at least partially overlaps a bandwidth of the second input signal;
      a first filter coupled with a frequency downconverter and adapted to receive the first input signal, the first filter and frequency downconverter adapted to filter the first input signal and downconvert the bandwidth of the first input signal to form a first output signal;
      a second filter coupled with a frequency upconverter and adapted to receive the second input signal, the second filter and frequency upconverter adapted to filter the second input signal and upconvert the bandwidth of the second input signal to form a second output signal; and
      a signal adder adapted to add the first output signal and the second output signal together to form a stage output signal such that a first output signal bandwidth is located in a lower portion of a stage output signal bandwidth and a second output signal bandwidth is located in an upper portion of the stage output signal bandwidth;
      wherein one of the one or more of the combiner stages is bypassed with a third input signal of the two or more input signals in the interleaved input signal by determining when data corresponding to the third input signal is included in a multiplexer output signal and when data from the stage output signal is included in the multiplexer output signal using control data in the interleaved input signal and a selector multiplexer coupled with the interleaved input signal and the stage output signal.

2. The system of claim 1, wherein the stage output signal is time interleaved such that the first and second stage output signals share a single data pathway.

3. The system of claim 1, wherein the one or more combiner stages each further comprises a selector multiplexer adapted to receive the stage output signal and the interleaved input signal, the selector multiplexor further adapted to use control data included in the interleaved input signal to select when data from the interleaved input signal corresponding to a third input signal is included in a multiplexer output signal coupled to the selector multiplexer and when data from the stage output signal is included in the multiplexer output signal.

4. The system of claim 1, wherein the interleaved input signal comprises three or more input signals.

5. The system of claim 1, further comprising a first upsampler coupled between the deinterleaver and the first filter, the first upsampler adapted to upsample the first input signal prior to the first filter by a predetermined factor.

6. The system of claim 5, further comprising a second upsampler coupled between the deinterleaver and the second filter, the second upsampler adapted to upsample the second input signal prior to the second filter by the predetermined factor.

7. The system of claim 6, wherein the stage output signal has a sample rate that is the same as a sample rate of the interleaved input signal.

8. The system of claim 6, wherein the predetermined factor is two.

9. The system of claim 1, wherein the first filter and the second filter are half-band linear-phase finite impulse response (FIR) filters.

10. A combiner system for frequency combining comprising:
    a plurality of combiner stages each comprising;
       a deinterleaver, at least one filter, a frequency downconverter, and a frequency upconverter all operatively coupled together and adapted to receive a complex interleaved input signal comprising two or more input signals time interleaved to share a single data pathway and each comprising a bandwidth and to output a complex stage output signal comprising the two or more input signals;
       wherein each of the plurality of combiner stages is adapted to alternately place the bandwidth of each of the two or more input signals in an upper portion and in a lower portion of an output bandwidth of the complex stage output signal;
       wherein the upper portion and lower portion are contiguous within the output bandwidth and joined at a center of the output bandwidth; and
       wherein a width of the output bandwidth is a sum of a width of each of the bandwidths of each of the two or more input signals; and
       wherein one of the one or more of the combiner stages is bypassed with a third input signal of the two or more input signals in the interleaved input signal by determining when data corresponding to the third input signal is included in a multiplexer output signal and when data from a stage output signal is included in the multiplexer output signal using control data in the interleaved input signal and a selector multiplexer coupled with the interleaved input signal and the stage output signal.

11. The system of claim 10, wherein the complex stage output signal is time interleaved such that the first and second stage output signals share a single data pathway.

12. The system of claim 10, wherein the plurality of combiner stages each further comprise a selector multiplexer and the selector multiplexer is adapted to use the control data in the complex interleaved input signal to determine when data corresponding to the third input signal in the interleaved input signal is included in the multiplexer output signal and when data from the complex stage output signal is included in the multiplexer output signal coupled to the selector multiplexer.

13. The system of claim 10, further comprising a first upsampler coupled between the deinterleaver and the at least one filter, the first upsampler adapted to upsample a first one of the two or more input signals prior to the at least one filter by a predetermined factor.

14. The system of claim 13, further comprising a second upsampler coupled between the deinterleaver and the at least one filter, the second upsampler adapted to upsample a second one of the two or more input signals prior to the at least one filter by the predetermined factor.

15. The system of claim 14, wherein the complex stage output signal has a sample rate that is the same as a sample rate of the complex interleaved input signal.

16. The system of claim 14, wherein the predetermined factor is two.

17. The system of claim 10, wherein the at least one filter is a half-band linear-phase finite impulse response (FIR) filter.

18. A method of frequency combining two or more input signals, the method comprising:
deinterleaving an interleaved input signal comprised of a plurality of input signals that are time interleaved to share a single data pathway to produce two or more input signals;
filtering a first input signal of the two or more input signals with at least one filter, the first input signal having a bandwidth that at least partially overlaps a bandwidth of a second input signal of the two or more input signals;
frequency downconverting the first input signal to place the bandwidth of the first input signal in a lower portion of an output bandwidth of a stage output signal;
filtering the second input signal with the at least one filter;
frequency upconverting the second input signal to place the bandwidth of the second input signal in an upper portion of the output bandwidth of the stage output signal, the upper portion and lower portion of the output bandwidth being contiguous;
forming the stage output signal by adding the first input signal to the second input signal using a signal adder after filtering the first input signal and filtering the second input signal;
sending the stage output signal for subsequent processing; and
bypassing one of a plurality of frequency combining stages with a third input signal of the two or more input signals in the interleaved input signal by determining when data corresponding to the third input signal is included in a multiplexer output signal and when data from a stage output signal is included in the multiplexer output signal using control data in the interleaved input signal and a selector multiplexer coupled with the interleaved input signal and the stage output signal.

19. The method of claim 18, further comprising determining, using control data in the interleaved input signal and a selector multiplexer coupled with the interleaved input signal and the stage output signal, when data corresponding to a third input signal of the two or more input signals in the interleaved input signal is included in a multiplexer output signal and when data from the stage output signal is included in the multiplexer output signal.

20. The method of claim 18, further comprising upsampling the first input signal and the second input signal by a predetermined factor prior to filtering the first input signal and filtering the second input signal.

21. A method of frequency combining two or more input signals, the method comprising:
frequency combining two or more input signals using one or more frequency combining stages to produce a stage output signal, each of the one or more frequency combining stages including at least one filter, a frequency upconverter, and a frequency downconverter;
wherein each of the one or more frequency combining stages is adapted to:
deinterleave an interleaved input signal comprising the two or more input signals that are time interleaved to share a single data pathway to produce at least a first input signal and a second input signal, the first input signal having a bandwidth that at least partially overlaps a bandwidth of the second input signal;
filter the first input signal with the at least one filter and frequency downconvert the first input signal to place the bandwidth of the first input signal in a lower portion of an output bandwidth of a stage output signal;
filter the second input signal with the at least one filter and frequency upconvert the second input signal to place the bandwidth of the second input signal in an upper portion of the output bandwidth of the stage output signal;
form the stage output signal by adding the first input signal and the second input signal with a signal adder after filtering the first input signal and filtering the second input signal; and
bypassing one of the one or more frequency combining stages with a third input signal of the two or more input signals in the interleaved input signal by determining when data corresponding to the third input signal is included in a multiplexer output signal and when data from the stage output signal is included in the multiplexer output signal using control data in the interleaved input signal and a selector multiplexer coupled with the interleaved input signal and the stage output signal.

22. The method of claim 21, further comprising upsampling the first input signal and the second input signal by a predetermined factor prior to filtering the first input signal and filtering the second input signal.

* * * * *